United States Patent
Lee et al.

(10) Patent No.: US 12,359,911 B2
(45) Date of Patent: Jul. 15, 2025

(54) METHOD OF CALCULATING THICKNESS OF GRAPHENE LAYER AND METHOD OF MEASURING CONTENT OF SILICON CARBIDE BY USING XPS

(71) Applicant: Samsung Electronics Co., Ltd., Suwon-si (KR)

(72) Inventors: Eunkyu Lee, Yongin-si (KR);
Yeonchoo Cho, Seongnam-si (KR);
Sangwon Kim, Seoul (KR);
Kyung-Eun Byun, Seongnam-si (KR);
Hyunjae Song, Hwaseong-si (KR);
Hyeonjin Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 18/412,823

(22) Filed: Jan. 15, 2024

(65) Prior Publication Data
US 2024/0151522 A1    May 9, 2024

Related U.S. Application Data

(62) Division of application No. 17/145,966, filed on Jan. 11, 2021, now Pat. No. 11,906,291.

(30) Foreign Application Priority Data

May 26, 2020    (KR) .......................... 10-2020-0063274

(51) Int. Cl.
*G01B 15/02*    (2006.01)
*G01N 23/2208*    (2018.01)
(Continued)

(52) U.S. Cl.
CPC ......... *G01B 15/02* (2013.01); *G01N 23/2208* (2013.01); *G01N 23/2273* (2013.01);
(Continued)

(58) Field of Classification Search
CPC ............ G01B 15/02; G01N 2223/085; G01N 2223/61; G01N 23/2208; G01N 23/2273; B82Y 35/00; H01L 22/12
See application file for complete search history.

(56) References Cited

U.S. PATENT DOCUMENTS

6,259,092 B1 * 7/2001 Brizzolara ............. B82Y 15/00
250/305
8,698,077 B2 * 4/2014 Hiura ................... G01N 23/225
250/306
(Continued)

FOREIGN PATENT DOCUMENTS

KR    2014/0089311 A    7/2014
WO    WO-2015152483 A1    10/2015

OTHER PUBLICATIONS

Hackley (Year: 2009).*
(Continued)

*Primary Examiner* — David J Makiya
*Assistant Examiner* — Soorena Kefayati
(74) *Attorney, Agent, or Firm* — Harness, Dickey & Pierce, P.L.C.

(57) ABSTRACT

A method of calculating a thickness of a graphene layer and a method of measuring a content of silicon carbide, by using X-ray photoelectron spectroscopy (XPS), are provided. The method of calculating the thickness of the graphene layer, which is directly grown on a silicon substrate, includes measuring the thickness of the graphene layer directly grown on the silicon substrate, by using a ratio between a signal intensity of a photoelectron beam emitted from the graphene layer and a signal intensity of a photoelectron beam emitted from the silicon substrate.

12 Claims, 11 Drawing Sheets

(51) Int. Cl.
*G01N 23/2273* (2018.01)
*H01L 21/285* (2006.01)
*H01L 21/66* (2006.01)
*H10D 64/62* (2025.01)

(52) U.S. Cl.
CPC ........ *H01L 21/28512* (2013.01); *H01L 22/12* (2013.01); *H10D 64/62* (2025.01); *G01N 2223/085* (2013.01); *G01N 2223/61* (2013.01)

(56) References Cited

U.S. PATENT DOCUMENTS

| | | | |
|---|---|---|---|
| 9,187,824 B2* | 11/2015 | Fisher | C01B 32/182 |
| 9,952,166 B2 | 4/2018 | Pois et al. | |
| 10,012,606 B1 | 7/2018 | Bakeman et al. | |
| 10,043,869 B2 | 8/2018 | Park et al. | |
| 2013/0087705 A1 | 4/2013 | Hiura et al. | |
| 2013/0344611 A1* | 12/2013 | Lee | B82Y 40/00 |
| | | | 428/457 |
| 2014/0149052 A1* | 5/2014 | Van Dyck | H01J 37/222 |
| | | | 702/28 |
| 2015/0192520 A1* | 7/2015 | Kyle | G01N 21/6458 |
| | | | 250/459.1 |
| 2016/0372328 A1* | 12/2016 | Kawada | H01L 21/046 |
| 2017/0176357 A1* | 6/2017 | Pois | G01B 15/02 |
| 2018/0328871 A1 | 11/2018 | Lee et al. | |
| 2019/0161351 A1 | 5/2019 | Song et al. | |
| 2019/0285548 A1 | 9/2019 | Nunney et al. | |
| 2020/0300788 A1 | 9/2020 | Yamanaka et al. | |
| 2021/0242450 A1 | 8/2021 | Jang et al. | |

OTHER PUBLICATIONS

J. Hackley, D. Ali, J. DiPasquale, J. D. Demaree, C. J. K. Richardson; Graphitic carbon growth on Si(111) using solid source molecular beam epitaxy. Sep. 28, 2009 Appl. Phys. Lett, 95 (13): 133114 (Year: 2009).*

Kyung Joong Kim et al., 'Determination of the Absolute Thickness of Ultrathin $Al_2O_3$ Overlayers on Si (100) Substrate' *Analytical Chemistry*, vol. 81, No. 20, Oct. 2009, pp. 8519-8522.

Kyung Joong Kim et al., 'Thickness measurement of a thin hetero-oxide film with an interfacial oxide layer by X-ray photoelectron spectroscopy' *Applied Surface Science*, vol. 258, 2012, pp. 3552-3556.

Kyung Joong Kim et al., 'A mutual calibration method to certify the thickness of nanometre oxide films' *Metrologia*, vol. 45, 2008, pp. 507-511.

S. Tanuma et al., 'Calculations of Electron Inelastic Mean Free Paths' *Surface and Interface Analysis*, vol. 17, 1991, pp. 927-939.

Peter J. Cumpson, 'The Thickogram: a method for easy film thickness measurement in XPS' *Surface and Interface Analysis*, vol. 29, 2000, pp. 403-406.

Extended European Search Report dated Jul. 14, 2021, issued in corresponding European Patent Application No. 21156223.6.

Chandra Shekhar Mohapatra, Growth and Characterization of epitaxial graphene films by molecular beam epitaxy (Dissertation), 2012.

Thermo Scientific, "Angle Resolved XPS" Application Note 31014, 2008.

Tai Lixuan et al., "Direct Growth of Graphene on Silicon by Metal-Free Chemical Vapor Deposition" *Nano-Micro Letters*, vol. 10, 2018.

J. Hackley et al., "Graphitic carbon growth on Si(111) using solid source molecular beam epitaxy" *Applied Physics Letters*, vol. 95, 2009, pp. 133114-1-133114-3.

"Chapter 4—Quantitative Analysis (Data Evaluation)" In: Siegfried Hofmann: "Auger- and X-Ray Photoelectron Spectroscopy in Materials Science: A User-Oriented Guide," 2012, Springer, Berlin / Heidelburg.

Zemlyanov, Dmitry Yet al. "Versatile Technique for Assessing Thickness of 2D Layered Materials by XPS." Nanotechnology 29.11 ( 2018): 115705-115705. Web. (Year: 2018).

Biedermann, Laura B. et al. "Insights into Few-Layer Epitaxial Graphene Growth on 4 H—SiC (000 1 ) Substrates from STM Studies." Physical review. B, Condensed matter and materials physics 79.12 (2009): n. pag. Web. (Year: 2009).

* cited by examiner

METHOD OF CALCULATING THICKNESS OF GRAPHENE LAYER AND METHOD OF MEASURING CONTENT OF SILICON CARBIDE BY USING XPS

CROSS-REFERENCE TO RELATED APPLICATION

This application is a divisional of U.S. application Ser. No. 17/145,966, filed on Jan. 11, 2021, which claims the benefit of Korean Patent Application No. 10-2020-0063274, filed on May 26, 2020, in the Korean Intellectual Property Office, the disclosure of each of which are incorporated herein in their entirety by reference.

BACKGROUND

1. Field

One or more embodiments relate to a method of calculating a thickness of a graphene layer directly grown on a silicon substrate and a method of measuring a content of silicon carbide included in an interface layer between the silicon substrate and the graphene layer by using X-ray photoelectron spectroscopy (XPS).

2. Description of Related Art

In the field of semiconductor devices, in order to address the increased resistance with reduction of a width of metal interconnects and to develop a new metal barrier material, studies about graphene have been actively conducted. Graphene is a material formed of two-dimensionally connected carbon atoms with a hexagonal honeycomb structure. Graphene has a very small thickness of an atomic size level. Graphene has higher electrophoresis compared to silicon and has many benefits, such as excellent thermal characteristics, chemical stability, and a large surface area.

SUMMARY

One or more example embodiments provide a method of calculating a thickness of a graphene layer directly grown on a silicon substrate and a method of measuring a content of silicon carbide included in an interface layer between the silicon substrate and the graphene layer by using X-ray photoelectron spectroscopy (XPS).

Additional aspects will be set forth in part in the description which follows and, in part, will be apparent from the description, or may be learned by practice of the presented embodiments of the disclosure.

According to an embodiment, a method of measuring a thickness of a graphene layer directly grown on a silicon substrate, by using an X-ray photoelectron spectroscopy (XPS) instrument, is provided. The method includes obtaining signal intensities from the graphene layer directly grown on the silicon substrate in response to emitting X-ray radiation toward the graphene layer directly grown on the silicon substrate using the XPS instrument; and calculating a thickness $t_G$ of the graphene layer according to an equation below:

$$t_G = \lambda_{EAL} \cos\alpha \ln\left(\frac{R_{exp}}{R_0} + 1\right)$$

wherein $R_0 = \frac{I_{co}}{I_{sio}}$, $R_{exp} = \frac{I_c}{I_{si}}$, $\lambda_{EAL}$ is an effective attenuation length, $\alpha$ is a detection angle for the XPS instrument, $I_{co}$ is a signal intensity of a photoelectron beam emitted from bulk-type graphene, $I_{sio}$ is a signal intensity of a photoelectron beam emitted from bulk-type silicon, $I_c$ is a signal intensity of a photoelectron beam emitted from the graphene layer and detected by a sensor on the XPS instrument in response to the graphene layer receiving X-ray radiation by the XPS instrument, and $I_{si}$ is a signal intensity of a photoelectron beam emitted from the silicon substrate and detected by the sensor on the XPS instrument in response to the silicon substrate receiving X-ray radiation by the XPS instrument, wherein the XPS instrument may obtain $R_0$ by a linear relationship between the signal intensity $I_{si}$ of the photoelectron beam emitted from the silicon substrate and the signal intensity $I_c$ of the photoelectron beam emitted from the graphene layer.

In some embodiments, the graphene layer may include crystalline graphene or nanocrystalline graphene.

In some embodiments, the effective attenuation length may be obtained via calibration, from a linear relationship between results of measurement by a transmission electron microscope and results of measurement by the XPS.

In some embodiments, the bulk-type graphene may have a thickness that is greater than or equal to about 10 nm.

According to another embodiment, a method of measuring a thickness of a graphene layer directly grown on a silicon substrate, by using an X-ray photoelectron spectroscopy (XPS) instrument, is provided. An interface layer is formed between the silicon substrate and the graphene layer. The method includes obtaining signal intensities from the graphene layer directly grown on the silicon substrate in response to emitting X-ray radiation toward the graphene layer directly grown on the silicon substrate using the XPS instrument; and calculating the thickness $t_G$ of the graphene layer according to an equation below:

$$t_G = \lambda_{EAL} \cos\alpha \ln\left(\frac{\frac{I_c}{R_0}}{K + I_{si}} + 1\right)$$

wherein $R_0 = \frac{I_{co}}{I_{sio}}$, $\lambda_{EAL}$ is an effective attenuation length, $\alpha$ is a detection angle for the XPS instrument, $I_{co}$ is a signal intensity of a photoelectron beam emitted from bulk-type graphene, $I_{sio}$ is a signal intensity of a photoelectron beam emitted from bulk-type silicon, $I_C$ is a signal intensity of a photoelectron beam emitted from the graphene layer and detected by a sensor on the XPS instrument in response to the graphene layer receiving X-ray radiation by the XPS instrument, $I_{si}$ is a signal intensity of a photoelectron beam emitted from the silicon substrate and detected by the sensor on the XPS instrument in response to the silicon substrate receiving X-ray radiation by the XPS instrument, and K is a corrected value based on an effect of the interface layer, wherein the XPS instrument may obtain $R_0$ by a linear relationship between the signal intensity $I_{si}$ of the photoelectron beam emitted from the silicon substrate and the signal intensity $I_c$ of the photoelectron beam emitted from the graphene layer.

In some embodiments, the interface layer may include silicon carbide, silicon oxycarbide, and silicon oxide.

In some embodiments, the graphene layer may include crystalline graphene or nanocrystalline graphene.

In some embodiments, the effective attenuation length may be obtained via calibration, from a linear relationship between results of measurement by a transmission electron microscope and results of measurement by the XPS.

According to another embodiment, a method is provided for measuring a content of silicon carbide included in an interface layer between a silicon substrate and a graphene layer directly grown on the silicon substrate. The method includes measuring the content of the silicon carbide by using a spectrum of a photoelectron beam emitted from the silicon substrate by using X-ray photoelectron spectroscopy (XPS).

In some embodiments, the interface layer may include silicon carbide, silicon oxycarbide, and silicon oxide.

In some embodiments, the content of the silicon carbide may be measured based on a ratio of a composition of the silicon carbide to a sum of the composition of the silicon carbide, a composition of the silicon oxycarbide, and a composition of the silicon oxide.

In some embodiments, the content of the silicon carbide may be measured by calculating a ratio of an area of a silicon carbide peak to a sum of the area of the silicon carbide peak, an area of a silicon oxycarbide peak, and an area of a silicon oxide peak in the spectrum of the photoelectron beam emitted from the silicon substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
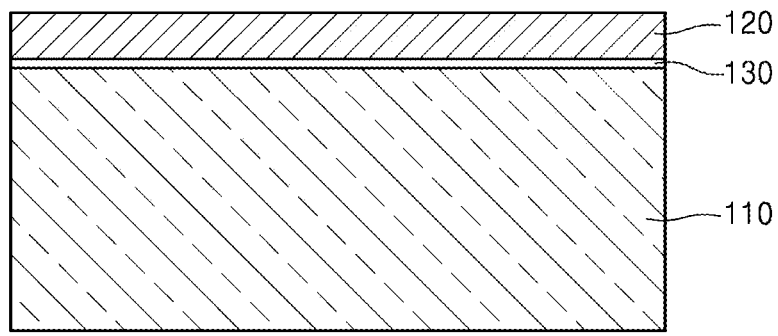
FIG. 1 illustrates a graphene layer directly grown on a silicon substrate.

Hereinafter, example embodiments will be described in detail with reference to the accompanying drawings. In the drawings, like reference numerals refer to like components, and the sizes of components may be exaggerated for clarity and convenience of description. The embodiments described hereinafter are only examples, and various modifications may be made from the embodiments.

Hereinafter, when a component is referred to as being "above" or "on" another component, the component may be directly on the other component, or indirectly on the other component with intervening components therebetween. As used herein, the singular forms "a," "an" and "the" are intended to include the plural forms as well, unless the context clearly indicates otherwise. Also, when a component is referred to as "including" another component, it denotes that the component may further include yet another component, instead of excluding yet other component, unless there is a specific description contrary thereto.

The use of the term "the" and other similar demonstratives may indicate both a singular form and a plural form. Unless a specific order is described with respect to operations included in a method or there is a contrary description, the operations may be performed in an appropriate order. The disclosure is not necessarily limited to a described order. All examples and example terms are used to describe the disclosure in detail, and unless it is defined by the scope of claims, the disclosure is not limited to these examples and example terms.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 illustrates a graphene layer 120 directly grown on a silicon substrate 110.

Referring to FIG. 1, the graphene layer 120 may be directly grown on the silicon substrate 110. In this case, an interface layer 130 may further be formed between the silicon substrate 110 and the graphene layer 120. Here, the interface layer 130 may be formed before the graphene layer 120 is grown, when silicon, carbon, oxygen, or the like are combined on the silicon substrate 110. Alternatively, the interface layer 130 may not be formed between the silicon substrate 110 and the graphene layer 120.

The graphene layer 120 may be directly grown on a surface of the silicon substrate 110, without a catalyst, by a deposition process. For example, the graphene layer 120 may be formed by thermal chemical vapor deposition (CVD), plasma enhanced CVD (PECVD), or the like. However, it is only an example. The graphene layer 120 may also be formed by atomic layer deposition (ALD), physical vapor deposition (PVD), or the like.

The graphene layer 120 may include crystalline graphene or nanocrystalline graphene. A ratio of carbon having a $sp^2$ bonding structure to the entire carbon may be obtained by measuring a D-parameter based via X-ray photoelectron spectroscopy (XPS). In detail, according to the ratio of the carbon having the $sp^2$ bonding structure to the entire carbon that is measured by the XPS, a peak shape of an Auger spectrum of carbon may be changed. A gap between a highest point and a lowest point in a D-parameter spectrum, which is formed by differentiating the peak shape, may correspond to the D-parameter. Thus, by measuring the D-parameter in the Auger spectrum with respect to carbon, crystalline graphene and nanocrystalline graphene may be separated.

The crystalline graphene may also be called intrinsic graphene and may include, for example, crystals of a size that is approximately greater than 100 nm. In the case of crystalline graphene, the D-parameter in the Auger spectrum with respect to carbon may be about 23 eV. In this case, the ratio of the carbon having the $sp^2$ bonding structure to the entire carbon may be about 100%. The crystalline graphene may include almost no hydrogen. Also, the crystalline graphene may have a density, for example, of about 2.1 g/cc, and have a sheet resistance, for example, of about 100 Ohm/sq to about 300 Ohm/sq. However, the disclosure is not limited thereto.

The nanocrystalline graphene may include crystals of a size which is less than the size of the crystalline graphene. For example, the nanocrystalline graphene may include crystals of a size, for example, of about 0.5 nm to about 100 nm. In the case of nanocrystalline graphene, the D-parameter in the Auger spectrum with respect to carbon may be about 18 eV to about 22.9 eV. In this case, the ratio of the carbon having the $sp^2$ bonding structure to the entire carbon may be about, for example, 50% to about 99%. The nanocrystalline graphene may include hydrogen, for example, of about 1% to about 20% (atomic percent). Also, the nanocrystalline graphene may have a density, for example, of about 1.6 g/cc to about 2.1 g/cc, and a sheet resistance that is, for example, greater than about 1000 Ohm/sq. However, the disclosure is not limited thereto.

The interface layer 130 may be formed between the silicon substrate 110 and the graphene layer 120. The interface layer 130 may be formed before the graphene layer 120 is grown, when silicon, carbon, oxygen, or the like are combined. For example, the interface layer 130 may include silicon carbide in which silicon and carbon are combined, silicon oxycarbide in which silicon, carbon, and oxygen are combined, and silicon oxide in which silicon and oxygen are combined.

Figure 2:
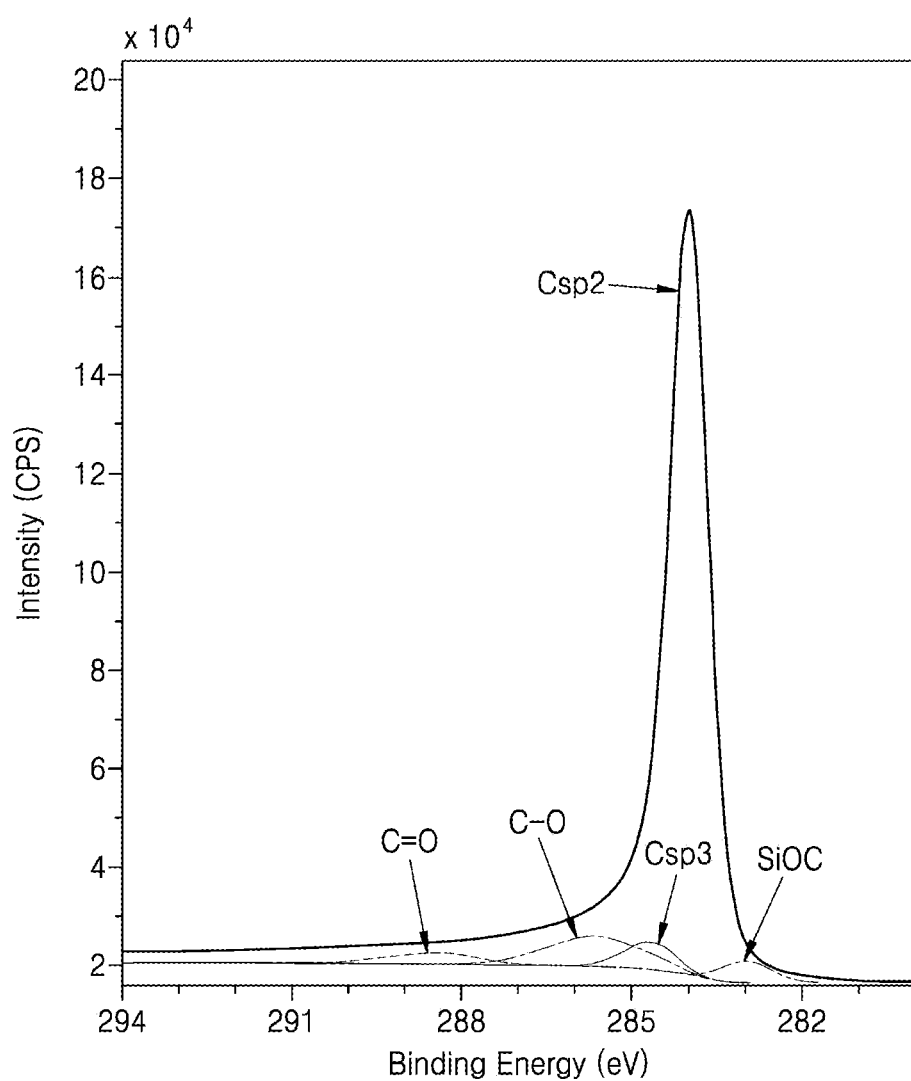
FIG. 2 illustrates an example of a C1s spectrum of a photoelectron beam emitted from a graphene layer by using X-ray photoelectron spectroscopy (XPS)
Figure 3:
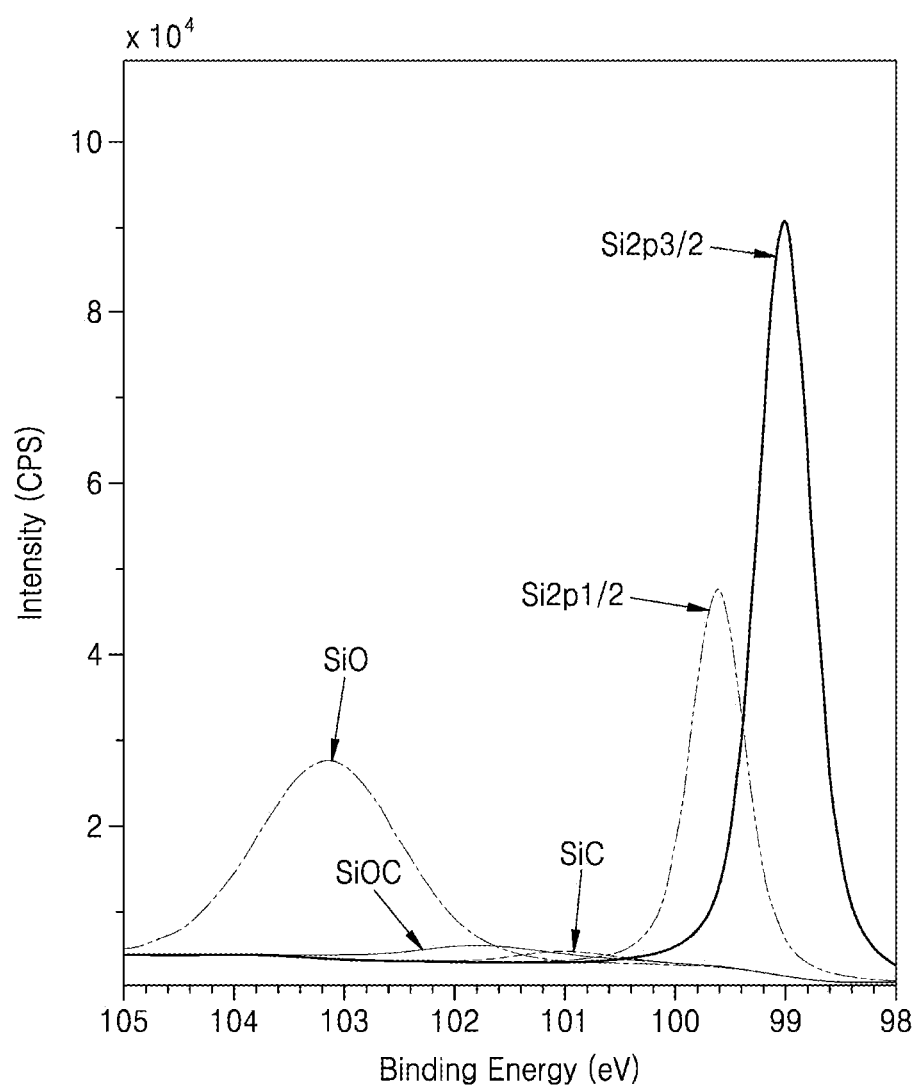
FIG. 3 illustrates an example of a Si2p spectrum of a photoelectron beam emitted from a silicon substrate by using XPS.

FIGS. 2 and 3 illustrate example spectrums of a photoelectron beam emitted from the structure illustrated in FIG. 1, using XPS.

FIG. 2 illustrates an example C1s spectrum of a photoelectron beam emitted from the graphene layer 120 by using the XPS. In FIG. 2, $Csp^2$ indicates carbon having a $sp^2$ bonding structure and $Csp^3$ indicates carbon having a spa bonding structure. Also, SiOC indicates silicon oxycarbide, C—O indicates single-bonded carbon and oxygen, and C=O indicates doubled-bonded carbon and oxygen. Referring to FIG. 2, the graphene layer 120 includes nanocrystalline graphene, which has a ratio of the carbon having the $sp^2$ bonding structure, the ratio corresponding to about 50% to about 99%.

FIG. 3 illustrates an example Si2p spectrum of a photoelectron beam emitted from the silicon substrate 110 by using XPS. In FIG. 3, SiC indicates silicon carbide, SiOC indicates silicon oxycarbide, and SiO indicates silicon oxide. Referring to FIG. 3, in addition to a silicon peak, a SiC peak, a SiOC peak, and a SiO peak are detected. Thus, it is identified that the interface layer 130 including SiC, SiOC, and SiO is formed between the silicon substrate 110 and the graphene layer 120.

Figure 4A:
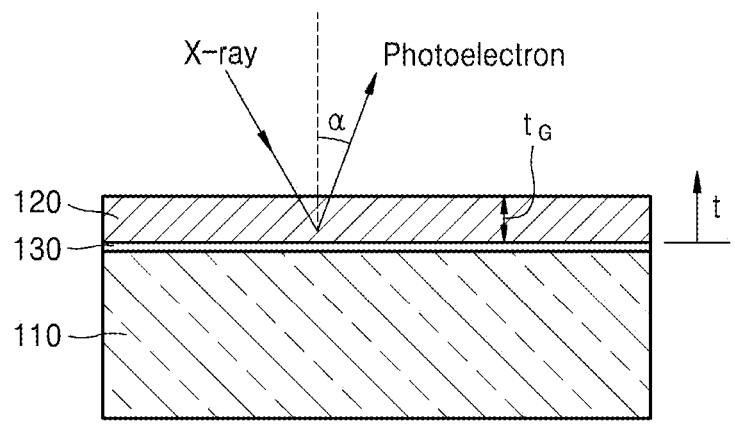
FIG. 4A illustrates generation of a photoelectron beam from a graphene layer, emission thereof to the outside, and detection thereof.

FIG. 4A illustrates generation of a photoelectron beam from the graphene layer 120, emission thereof to the outside, and detection thereof. Referring to FIG. 4A, when an X-ray emitted from an X-ray source (not shown) is irradiated onto the graphene layer 120, a photoelectron beam may be generated from the graphene layer 120 and emitted to the outside, and the photoelectron beam emitted as described above may be detected by a detector (not shown). FIG. 4A illustrates that the photoelectron beam generated from the graphene layer 120 is emitted at a certain angle α with respect to a perpendicular direction of the graphene layer 120 and is detected.

Figure 4B:
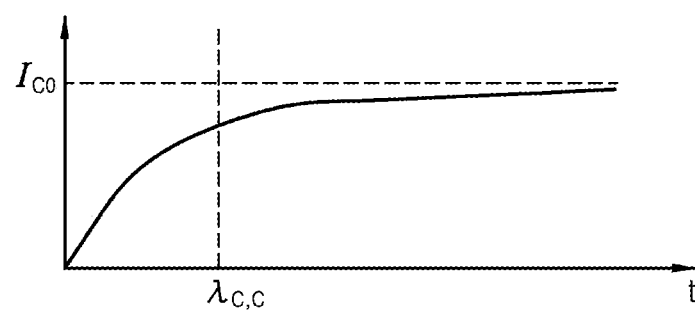
FIG. 4B illustrates a signal intensity of the photoelectron beam emitted from the graphene layer of FIG. 4A, according to a thickness of the graphene layer.

FIG. 4B illustrates a signal intensity of the photoelectron beam emitted from the graphene layer 120 of FIG. 4A according to a thickness of the graphene layer 120. An interaction formula of the signal intensity of the photoelectron beam emitted from the graphene layer 120 and a thickness t of the graphene layer 120 may correspond to Equation 1 below.

$$\frac{I_C}{I_{Co}} = 1 - \exp\left(-\frac{t}{\lambda_{C,C}\cos\alpha}\right) \quad \text{(Equation 1)}$$

In Equation 1, "$I_C$" indicates a signal intensity of the photoelectron beam emitted from the graphene layer 120 and "$I_{C0}$" indicates a signal intensity measured from a photoelectron beam emitted from bulk-type graphene. Here, the bulk-type graphene may be a graphene body having a great thickness (for example, a thickness that is equal to or greater than about 10 nm). "$\lambda_{c,c}$" indicates an inelastic mean free path of the photoelectron beam generated from the graphene layer 120 and transmitted through the graphene layer 120. Also, "α" indicates a detection angle of the photoelectron beam emitted from the graphene layer 120.

Figure 5A:
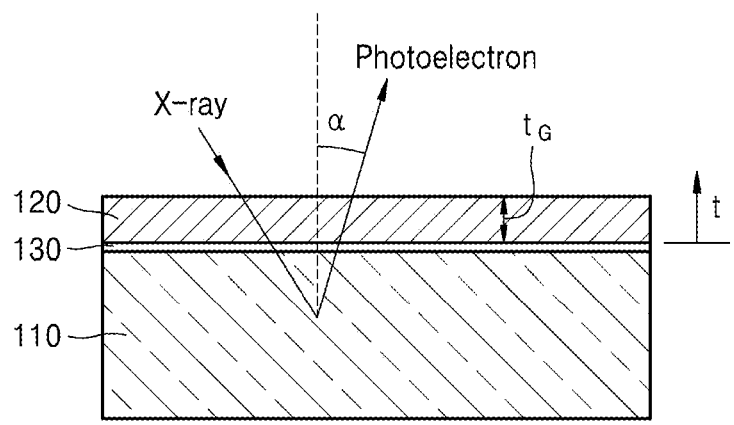
FIG. 5A illustrates generation of a photoelectron beam from a silicon substrate, and emission and detection thereof.

FIG. 5A illustrates generation, emission, and detection of a photoelectron beam generated from the silicon substrate 110. Referring to FIG. 5A, when an X-ray emitted from an X-ray source and transmitted through the graphene layer 120 is irradiated onto the silicon substrate 110, a photoelectron beam may be generated from the silicon substrate 110 and emitted to the outside, and the emitted photoelectron beam may be detected by a detector. FIG. 5A illustrates that the photoelectron beam generated from the silicon substrate 110 is emitted at a certain angle α based on a perpendicular direction of the graphene layer 120 and is detected.

Figure 5B:
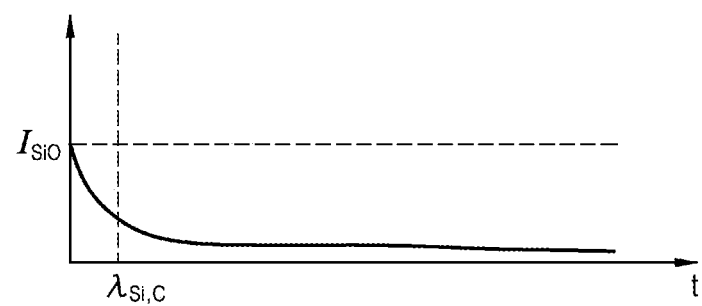
FIG. 5B illustrates a signal intensity of the photoelectron beam emitted from the silicon substrate of FIG. 5A through a graphene layer, according to a thickness of the graphene layer.

FIG. 5B illustrates a signal intensity of the photoelectron beam emitted from the silicon substrate 110 of FIG. 5A according to a thickness of the graphene layer 120. An interaction formula of the signal intensity of the photoelectron beam emitted from the silicon substrate 110 and the thickness t of the graphene layer 120 may correspond to Equation 2 below.

$$\frac{I_{Si}}{I_{Sio}} = -\exp(-\frac{t}{\lambda_{Si,C}\cos\alpha})$$ (Equation 2)

In Equation 2, "$I_{Si}$" indicates a signal intensity of the photoelectron beam emitted from the silicon substrate 110 and "$I_{Sio}$" indicates a signal intensity measured from a photoelectron beam emitted from bulk-type silicon. Here, the bulk-type silicon may be a silicon body having a great thickness. "$\lambda_{si,c}$" indicates an inelastic mean free path of the photoelectron beam generated from the silicon substrate 110 and transmitted through the graphene layer 120.

As a method of calculating a thickness of the graphene layer 120, there may be a method using a signal intensity of a photoelectron beam emitted from the graphene layer 120. Based on this method, a thickness $t_G$ of the graphene layer 120 may be calculated by Equation 3 below based on Equation 1 described above.

$$t_G = -\lambda_{EAL}\cos\alpha\ln(1 - \frac{Ic}{I_{co}})$$ (Equation 3)

(In Equation 3), "$\lambda_{EAL}$" is a value defined for measuring an actual thickness and indicates an effective attenuation length. Also, "$I_{CO}$" indicates a signal intensity measured from a photoelectron beam emitted from bulk-type graphene, and "$I_C$" indicates a signal intensity measured from a photoelectron beam emitted from the graphene layer 120.

$\lambda_{EAL}$ described in Equation 3 may be obtained by the following calibration and may relatively accurately calculate the thickness of the graphene layer 120.

According to the method of measuring the thickness by using the XPS based on Equation 1, described above, the absolute thickness may not be accurately calculated, but a ratio between different thicknesses may be accurately calculated. In particular, in the case in which a measuring signal is not detected, an actual thickness may become precisely "0." According to the method of measuring the thickness by using the XPS, an offset may be "0." Thus, Equation 4 below may be formed between the actual thickness $t_G$ of the graphene layer 120 and a thickness $t_{XPS}$ of the graphene layer 120 that is calculated by the XPS.

$$t_G = t_{XPS} \times m$$ (Equation 4)

In Equation 4, "m" indicates a scaling factor for XPS.

Also, Equation 5 below may be formed based on Equation 4.

$$\lambda_{EAL} = m \times \lambda_{C,C}$$ (Equation 5)

According to a method of measuring a thickness by using a transmission electron microscope (TEM), the absolute thickness may be measured, but it may be difficult to accurately define a location of an interface, due to roughness or contamination of the interface. Accordingly, according to the method of measuring the thickness by using the TEM, the measured absolute thickness may include certain deviation.

Thus, an interaction formula, such as Equation 6 below, may be formed between the actual thickness $t_G$ of the graphene layer 120 and a thickness $t_{TEM}$ of the graphene layer 120 that is calculated by the TEM.

$$t_G = t_{TEM} + c$$ (Equation 6)

In Equation 6, "c" indicates an offset for the TEM.

Also, Equation 7 below may be formed from Equation 4 and Equation 6.

$$t_G = t_{XPS} \times m = t_{TEM} + c$$ (Equation 7)

Based on Equation 7, it is shown that a linear relationship may be formed between the thickness $t_{XPS}$ of the graphene layer 120 that is calculated by the XPS and the thickness $t_{TEM}$ of the graphene layer that is calculated by the TEM. Thus, a conversion factor m for the XPS may be determined via calibration, from the linear relationship between results of the measurement by the XPS and results of the measurement by the TEM. Also, $\lambda_{EAL}$ may be obtained according to Equation 5 by using the determined conversion factor m for the XPS, and the thickness $t_G$ of the graphene layer 120 may be calculated by using Equation 3.

Hereinafter, methods of calculating a thickness of the graphene layer 120 directly grown on the silicon substrate 110 by using XPS, according to example embodiments, will be described.

The methods of calculating the thickness of the graphene layer 120 according to the example embodiments may include methods of using a ratio between a signal intensity of a photoelectron beam emitted from the graphene layer 120 and a signal intensity of a photoelectron beam emitted from the silicon substrate 110. The methods may be used both in the case in which the interface layer 130 is not formed between the silicon substrate 110 and the graphene layer 120 and the case in which the effect of the interface layer 130 is not reflected.

The thickness $t_G$ of the graphene layer 120 may be calculated by Equation 8 below based on Equation 1 and Equation 2 described above. Here, Equation 8 is calculated based on assumption that $\lambda_{c,c}$ described in Equation 1 and $\lambda_{si,c}$ described in Equation 2 have the same value.

$$t_G = \lambda_{EAL}\cos\alpha\ln(\frac{R_{exp}}{R_0} + 1)$$ (Equation 8)

$$\text{wherein, } R_0 = \frac{I_{Co}}{I_{Sio}}, R_{exp} = \frac{I_C}{I_{Si}}$$

"$\lambda_{EAL}$" indicates a value defined for measuring an actual thickness of a layer as described above and indicates an effective attenuation length. Also, "$I_{Co}$" indicates a signal intensity measured from a photoelectron beam emitted from bulk-type graphene, and "$I_{Sio}$" indicates a signal intensity measured from a photoelectron beam emitted from bulk-type silicon. Also, "$I_C$" indicates a signal intensity measured from a photoelectron beam emitted from the graphene layer 120, and "$I_{Si}$" indicates a signal intensity measured from a photoelectron beam emitted from the silicon substrate 110 through the graphene layer 120.

The method of obtaining $\lambda_{EAL}$ is described above, and thus, its detailed description will be omitted. $R_0$ may be obtained by calculating a ratio of the signal intensity $I_{Co}$ measured from the photoelectron beam emitted from the bulk-type graphene to the signal intensity $I_{Sio}$ measured from the photoelectron beam emitted from the bulk-type silicon. However, in this case, the bulk-type graphene having a thickness that is equal to or greater than about 10 nm has to be manufactured.

According to the present embodiment, $R_0$ may be obtained from the linear relationship formed between the signal intensity $I_{Si}$ of the photoelectron beam emitted from the silicon substrate 110 and the signal intensity $I_C$ of the photoelectron beam emitted from the graphene layer 120.

In detail, Equation 9 below may be formed from Equation 1 and Equation 2. Here, Equation 9 is calculated by assuming that $\lambda_{c,c}$ described in Equation 1 and $\lambda_{si,c}$ described in Equation 2 have the same value.

$$I_{Si} = -\frac{1}{R_0} \times I_C + I_{SiO} \quad \text{(Equation 9)}$$

According to Equation 9, it is identified that a linear relationship may be formed between the signal intensity $I_{Si}$ of the photoelectron beam emitted from the silicon substrate 110 and the signal intensity $I_C$ of the photoelectron beam emitted from the graphene layer 120.

Figure 6:
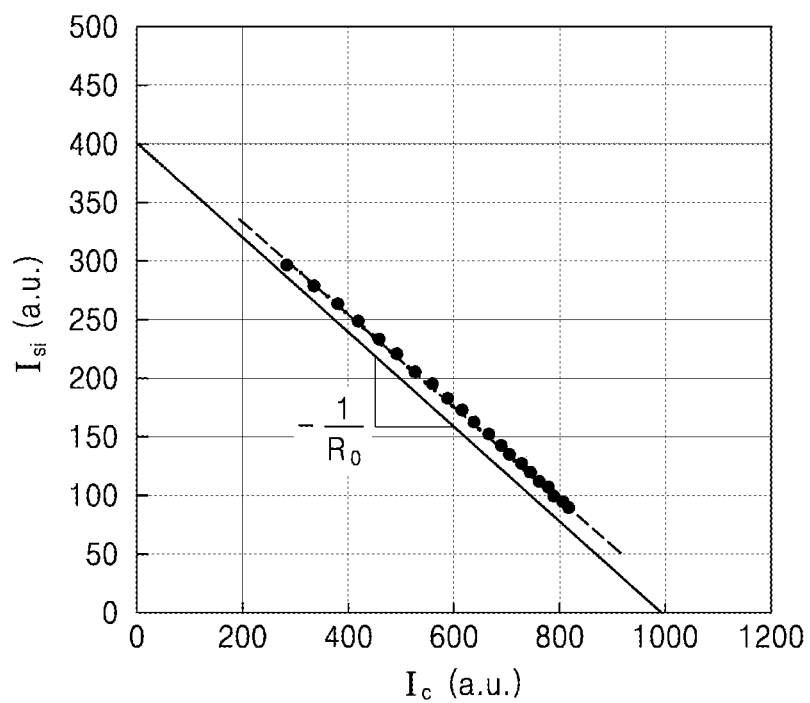
FIG. 6 is a data graph showing results of measurement of a signal intensity ($I_{Si}$) of a photoelectron beam emitted from a silicon substrate and measurement of a signal intensity ($I_C$) of a photoelectron beam emitted from a graphene layer (nanocrystalline graphene), with respect to changes in a thickness of the graphene layer (nanocrystalline graphene) grown on the silicon substrate.

FIG. 6 is a data graph illustrating results of measurement of the signal intensity $I_{Si}$ of the photoelectron beam emitted from the silicon substrate 110 and the signal intensity $I_C$ of the photoelectron beam emitted from the graphene layer 120 (nanocrystalline graphene), the measurement being performed by changing a thickness of the graphene layer (nanocrystalline graphene) 120 grown on the silicon substrate 110 within a range of about 1 nm to about 5 nm.

It is identified from the data graph illustrated in FIG. 6 that the linear relationship may be formed between the signal intensity $I_{Si}$ of the photoelectron beam emitted from the silicon substrate 110 and the signal intensity $I_C$ of the photoelectron beam emitted from the graphene layer 120. Here, an inclination of a straight line formed by the data graph illustrated in FIG. 6 may correspond to $-1/R_0$ of Equation 9. Thus, the value of $R_0$ may be obtained by measuring the inclination of a straight line formed by the data graph illustrated in FIG. 6.

As shown above, according to the method of calculating the thickness of the graphene layer 120 according to the present embodiment, the thickness of the graphene layer 120 may be measured by using the ratio between the signal intensity of the photoelectron beam emitted from the graphene layer 120 and the signal intensity of the photoelectron beam emitted from the silicon substrate 110 as shown in Equation 8.

Another example of the method of calculating the thickness of the graphene layer 120, according to another embodiment, may include a method of reflecting the effect of the interface layer 130 to Equation 8 described above when the interface layer 130 is formed between the silicon substrate 110 and the graphene layer 120. Here, the interface layer 130 may include silicon carbide, silicon oxycarbide, and silicon oxide as described above. Based on this method, the thickness $t_G$ of the graphene layer 120 may be calculated by Equation 10 below.

$$t_G = \lambda_{EAL} \cos\alpha \ln\left(\frac{\frac{I_C}{R_0}}{K + I_{Si}} + 1\right) \quad \text{(Equation 10)}$$

In Equation 10, "K" is a corrected value based on the effect of the interface layer 130 and may be defined by Equation 11 below.

$$K = \frac{I_{SiC}}{R_{SiC/Si}} + \frac{I_{SiOC}}{R_{SiOC/Si}} + \frac{I_{SiO}}{R_{SiO/Si}} \quad \text{(Equation 11)}$$

-continued $$\text{wherein, } R_{SiC/Si} = \frac{I_{SiCo}}{I_{Sio}}, R_{SiOC/Si} = \frac{I_{SiOCo}}{I_{Sio}}, R_{SiO/Si} = \frac{I_{SiOo}}{I_{Sio}}$$

"$I_{SiCo}$," "$I_{SiOC}$," and "$I_{SiOo}$" are respectively signal intensities measured from photoelectron beams emitted from bulk-type silicon carbide, bulk-type silicon oxycarbide, and bulk-type silicon oxide.

In Equation 10, $R_0$ may be obtained from the linear relationship formed between the signal intensity $I_{Si}$ of the photoelectron beam emitted from the silicon substrate 110 and the signal intensity $I_C$ of the photoelectron beam emitted from the graphene layer 120, as described above.

As shown above, according to the method of calculating the thickness of the graphene layer 120 according to the example embodiment, the thickness of the graphene layer 120 directly grown on the silicon substrate 110 may be relatively accurately calculated by using the ratio between the signal intensity of the photoelectron beam emitted from the graphene layer 120 and the signal intensity of the photoelectron beam emitted from the silicon substrate 110, the signal intensities being measured by using the XPS.

As illustrated in FIG. 1, the interface layer 130 may be formed between the silicon substrate 110 and the graphene layer 120. Also, silicon carbide may be included in the interface layer 130. Here, the silicon carbide is a material generated when silicon and carbon are combined. As a content of the silicon carbide is increased, adhesion between the silicon substrate 110 and the graphene layer 120 may be increased.

Hereinafter, a method of measuring a content of silicon carbide included in the interface layer 130 formed between the silicon substrate 110 and the graphene layer 120 in the structure illustrated in FIG. 1 will be described.

Figure 7:
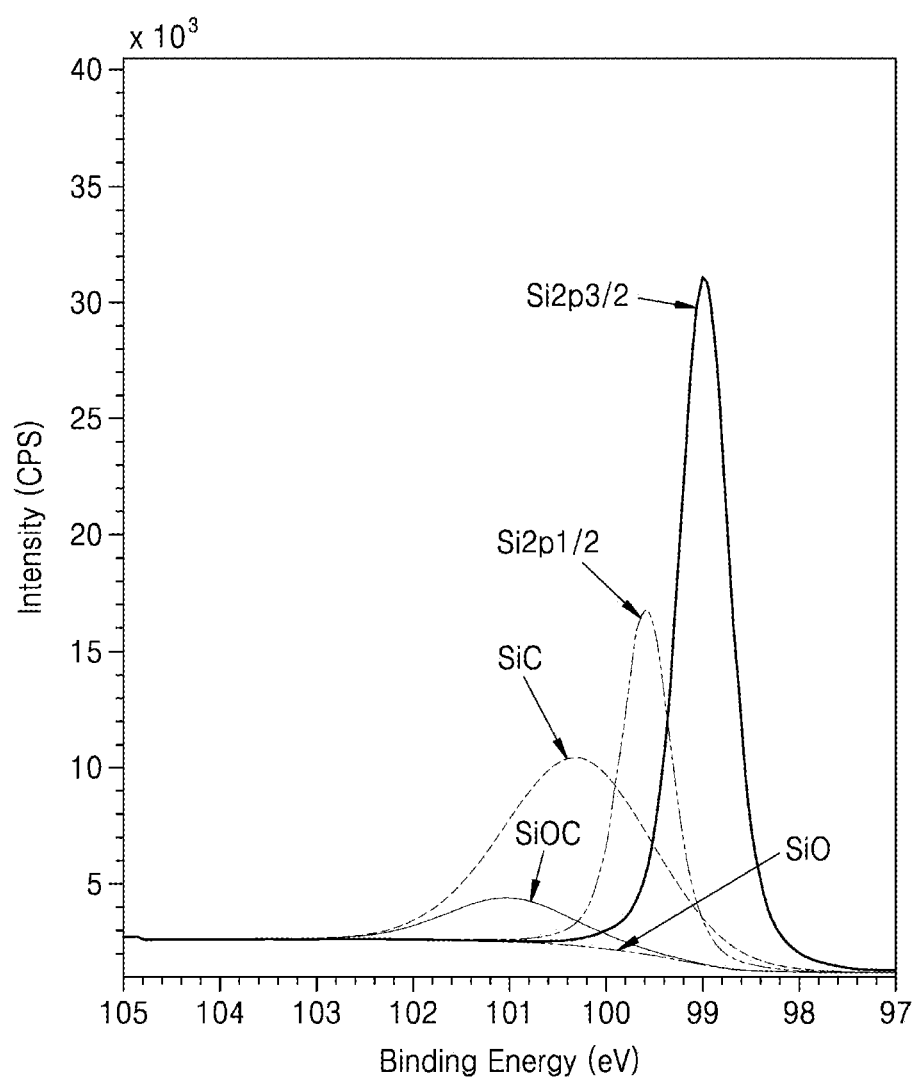
FIG. 7 illustrates another example of a Si2p spectrum of a photoelectron beam emitted from a silicon substrate by using XPS.

FIG. 7 illustrates an example Si2p spectrum of a photoelectron beam emitted from the silicon substrate 110 by using XPS. In FIG. 7, SiC indicates silicon carbide, SiOC indicates silicon oxycarbide, and SiO indicates silicon oxide.

Referring to FIG. 7, in addition to a silicon peak, a SiC peak, a SiOC peak, and a SiO peak are detected. Thus, it is identified that the interface layer 130 including SiC, SiOC, and SiO is formed between the silicon substrate 110 and the graphene layer 120.

The content of the silicon carbide in the interface layer 130 may be measured by a ratio of a composition of the silicon carbide to the sum of the composition of the silicon carbide, a composition of the silicon oxycarbide, and a composition of the silicon oxide.

According to the present example embodiment, the content of the silicon carbide included in the interface layer 130 may be measured by measuring a signal intensity of silicon carbide, a signal intensity of silicon oxycarbide, and a signal intensity of silicon oxide in the spectrum illustrated in FIG. 7.

In detail, the content of the silicon carbide included in the interface layer 130 may be measured by calculating a ratio of an area of a silicon carbide peak to the sum of the area of the silicon carbide peak, an area of a silicon oxycarbide peak, and an area of a silicon oxide peak.

Figure 8:
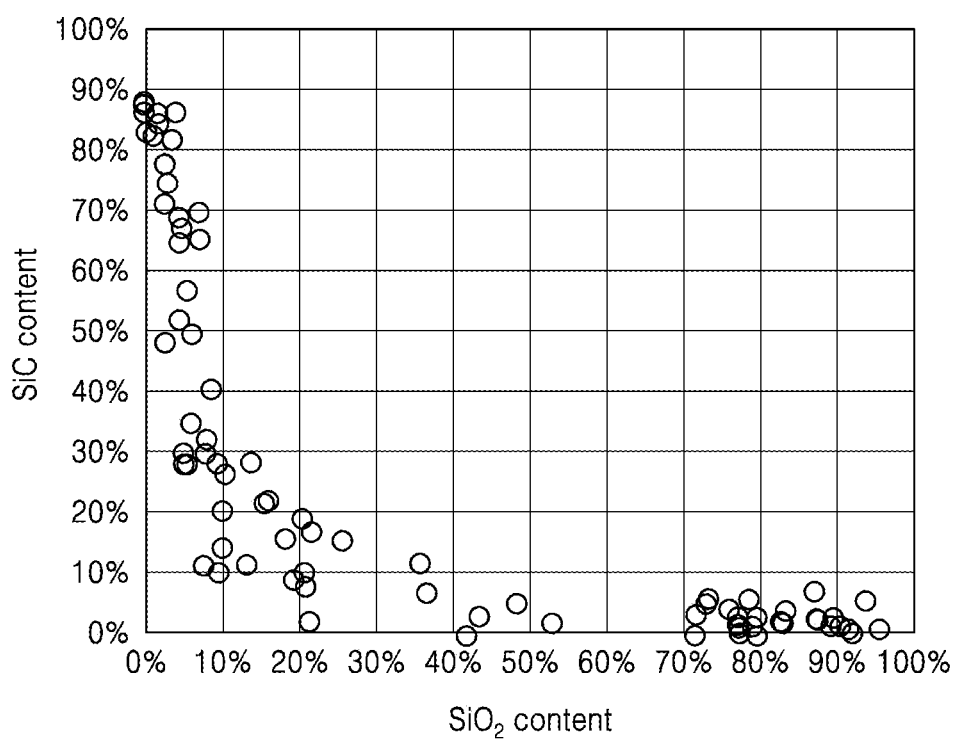
FIG. 8 shows experimental results with respect to changes in a content of silicon carbide included in an interface layer formed between a silicon substrate and a graphene layer, the changes being generated as conditions of a deposition process are changed, when the graphene layer is directly grown on the silicon substrate.

FIG. 8 illustrates results of measuring contents of silicon carbide and silicon oxide included in an interface layer formed between a silicon substrate and a graphene layer, when growing the graphene layer on the silicon substrate by changing process conditions in a PECVD process.

The content of the silicon carbide and the content of the silicon oxide illustrated in FIG. 8 correspond to the results obtained by using the method of measuring the contents of the silicon carbide and the silicon oxide, according to the example embodiment described above. That is, the content of the silicon carbide may be measured by calculating the ratio of the area of the silicon carbide peak to the sum of the area of the silicon carbide peak, the area of the silicon oxycarbide peak, and the area of the silicon oxide peak in the spectrum emitted from the silicon substrate. Also, the content of the silicon oxide may be measured by calculating the ratio of the area of the silicon oxide peak to the sum of the area of the silicon carbide peak, the area of the silicon oxycarbide peak, and the area of the silicon oxide peak in the spectrum emitted from the silicon substrate.

According to the present embodiment, the content of the silicon carbide included in the interface layer may be relatively accurately measured by measuring the signal intensity of the silicon carbide, the signal intensity of the silicon oxycarbide, and the signal intensity of the silicon oxide in the spectrum emitted from the silicon substrate.

According to the example embodiments described above, the thickness of the graphene layer directly grown on the silicon substrate may be relatively accurately calculated by using the ratio between the signal intensity of the photoelectron beam emitted from the graphene layer and the signal intensity of the photoelectron beam emitted from the silicon substrate by using the XPS. Also, the content of the silicon carbide included in the interface layer may be relatively accurately measured by measuring the signal intensity of the silicon carbide, the signal intensity of the silicon oxycarbide, and the signal intensity of the silicon oxide in the spectrum emitted from the silicon substrate.

Figure 9:
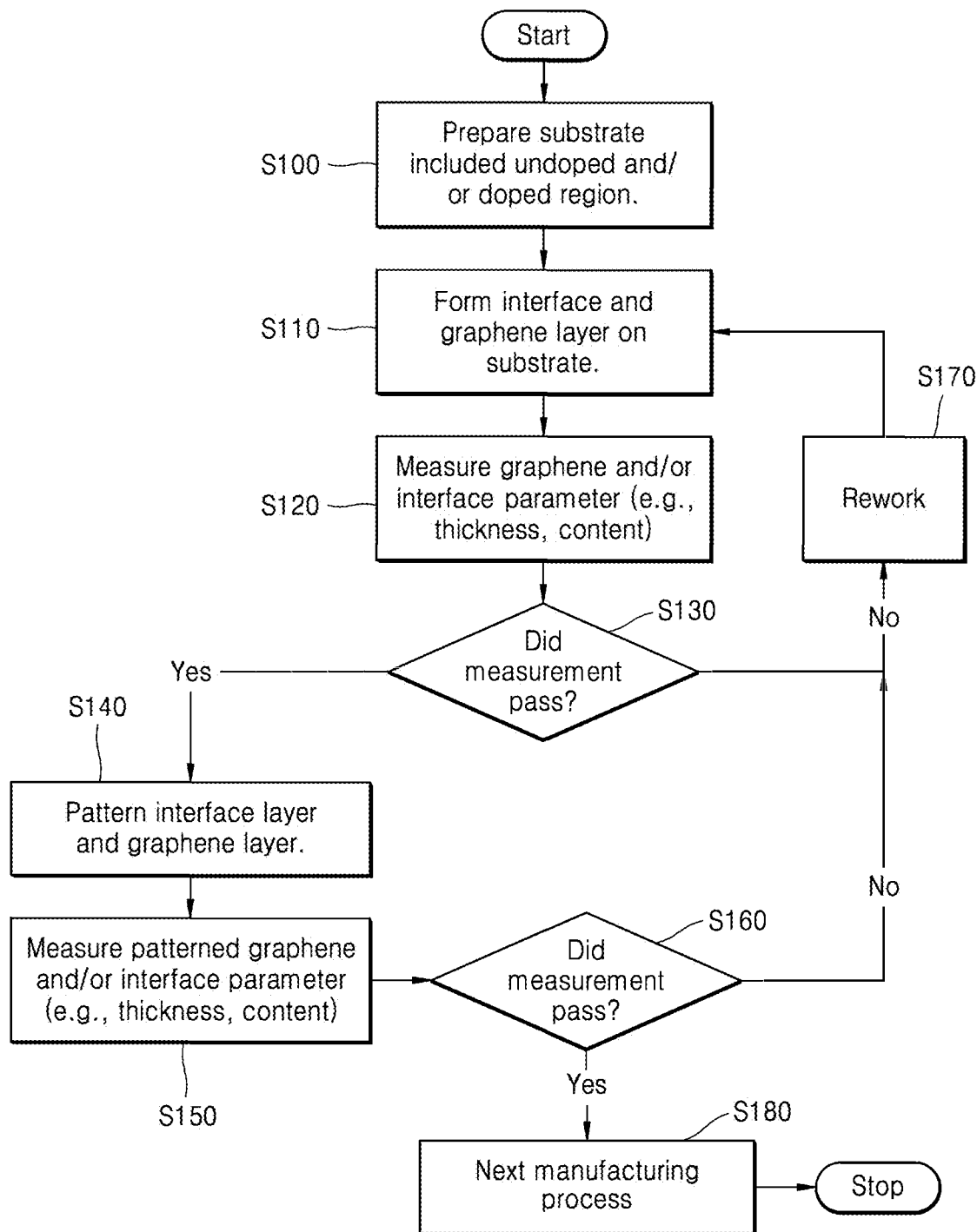
FIG. 9 is a flow chart illustrating a method of manufacturing a graphene device according to an example embodiment.

FIG. 9 is a flow chart illustrating a method of manufacturing a graphene device according to an example embodiment. FIGS. 10A to 10D are cross-sectional views illustrating a method of manufacturing a graphene device according to an example embodiment. FIGS. 11A to 11D are cross-sectional views illustrating a method of manufacturing a graphene device according to an example embodiment.

In FIGS. 9, 10A to 10D, and 11A to 11D, for ease of description, examples are described where the interface layer 130 is formed between the graphene layer 120 and the substrate 110, but example embodiments are not limited thereto and the examples in FIGS. 9, 10A to 10D, and 11A to 11D may be modified to manufacture graphene devices without forming the interface layer 130 between the graphene layer 120 and the substrate 110.

Figure 10A:
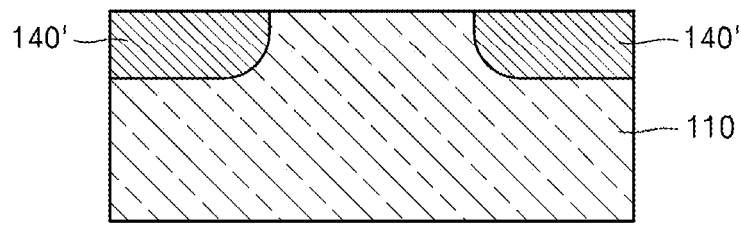
FIGS. 10A to 10D are cross-sectional views illustrating a method of manufacturing a graphene device according to an example embodiment.
Figure 11A:
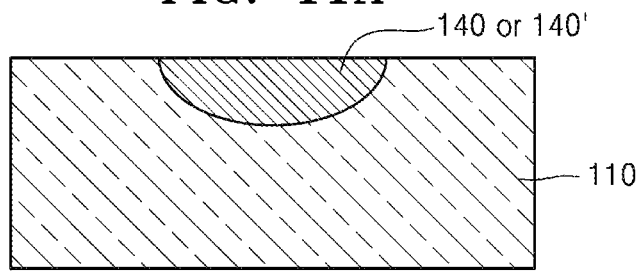
FIGS. 11A to 11D are cross-sectional views illustrating a method of manufacturing a graphene device according to an example embodiment.

Referring to FIGS. 9, 10A, and 11A, in operation S100, a substrate 110 (e.g., silicon substrate) may be provided. As shown in FIG. 10A, doped areas 140' spaced apart from each other may be formed in upper regions of the substrate 110 by implanting impurities into the substrate 110. As shown in FIG. 11A, the substrate 110 may include an undoped area 140 or a doped area 140' below an upper surface of the substrate 110.

Figure 10B:
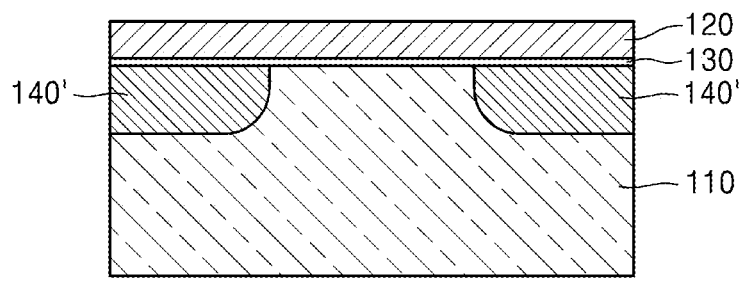
Figure 11B:
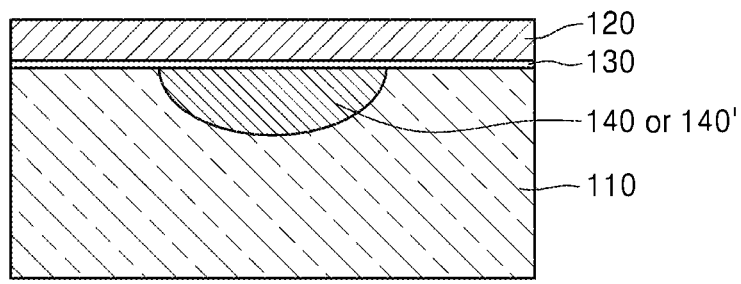

Referring to FIGS. 9, 10B, and 11B, in operation S110, a graphene layer 120 may be directly grown on the upper surface of the substrate 110. An interface layer 130 may be formed between the substrate 110 and the graphene layer 120, but in other embodiments the interface layer 130 may not be formed.

Referring to FIG. 9, in operation S120, the graphene layer 120 and/or interface layer 130 may be measured using an XPS instrument. For example, the thickness of the graphene layer 120 may be measured according to the embodiments discussed above to provide a measured thickness of the graphene layer 120. Also, the content (e.g., silicon carbide content) of the interface layer 130 may be measured using the XPS instrument according to the embodiments discussed above to provide a measured content of the interface layer 130. In operation S130, a controller (not shown) of the XPS instrument may compare the measured thickness of the graphene layer 120 to a first threshold value and a second threshold value greater than the first threshold value. The first threshold value and the second threshold value may be reference values corresponding to control limits for the thickness of the graphene layer 120, but are not limited thereto.

In operation S130, the controller (not shown) may compare the content of the interface layer 130 to a third threshold value and a fourth threshold value greater than the third threshold value. The third threshold value and the fourth threshold value may be reference values corresponding to control limits for the content (e.g., content of silicon carbide in the interface layer 130) of the interface layer 130, but are not limited thereto.

Figure 10C:
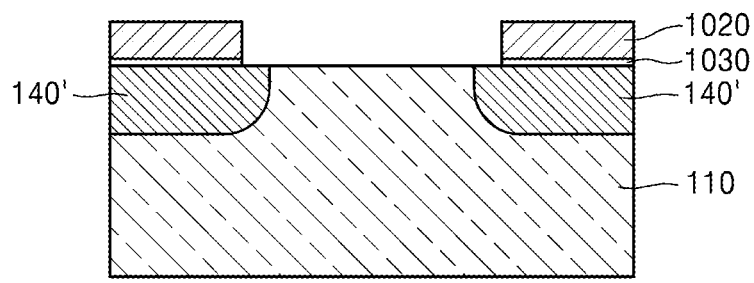
Figure 11C:
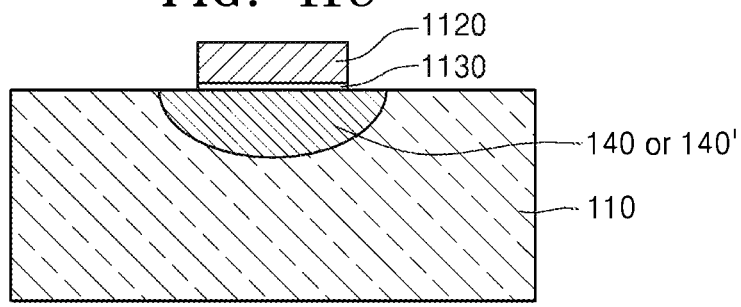

Referring to FIGS. 9, 10C, and 11C, in response to the measured thickness of the graphene layer 120 and/or the measured content of the interface layer 130 having acceptable values in operation S130, operation S140 may be performed. For example, in operation S130, an acceptable value of the measured thickness of the graphene layer 120 may be greater than or equal to the first threshold value and less than or equal to the second threshold value. Also, in operation S130, an acceptable value of the measured content of the interface layer 130 may be greater than or equal to the third threshold value and less than or equal to the fourth threshold value. However, example embodiments are not limited thereto.

In operation S140, as shown in FIG. 10C, the interface layer 130 and graphene layer 120, may be patterned to provide an interface pattern 1030 and a graphene pattern 1020 thereon, both covering at least part of the doped areas 140' and exposing a portion of the substrate 110 between the doped areas 140'. As shown in FIG. 11C, the interface layer 130 and graphene layer 120 may be patterned to provide an interface pattern 1130 and a graphene pattern 1120 thereon, both covering at least part of the undoped area 140 or doped area 140' and exposing a portion of the substrate 110 surrounding the undoped area 140 or doped area 140.

Alternatively, referring to FIGS. 9, 10B, and 11B, operation S170 may be performed in response to the measured thickness of the graphene layer 120 and/or the measured content of the interface layer 130 having unacceptable values in operation S130. Operation S170 may be referred to as a rework operation. In operation S170, the graphene layer 120 and the interface layer 130 may be removed. After removing the graphene layer 120 and the interface layer 130 in operation S170, the method may proceed to operation S110 where another graphene layer 120 may be grown on the substrate 110 as shown in FIGS. 10B and 11B. Another interface layer 130 may be formed between the graphene layer 120 and the substrate 100, or the interface layer 130 may be omitted in other embodiments. Next, the manufacturing method may proceed to operation S120 after operation S110 has been performed.

Referring to FIGS. 9, 10C, and 11C, operation S150 may be performed after forming the graphene pattern 1020 and interface pattern 1030 in FIG. 10C and/or after forming the graphene pattern 1120 and interface pattern 1130 in FIG. 11C according to operation S140.

In operation S150, the graphene patterns 1020 and 1120 and/or interface patterns 1030 and 1130 may be measured using an XPS instrument. Operation S150 may be similar to operation S120. For example, the thickness of the graphene patterns 1020 and 1120 may be measured according to the embodiments discussed above to provide a measured thickness of the graphene pattern 1020 and 1120. Also, the content (e.g., silicon carbide content) of the interface pattern 1030 and 1130 may be measured using the XPS instrument according to the embodiments discussed above to provide a measured content of the interface layer 130.

In operation S160, a controller (not shown) of the XPS instrument may compare the measured thickness of the graphene patterns 1020 and 1120 to a fifth threshold value and a sixth threshold value greater than the fifth threshold value. The fifth threshold value and the sixth threshold value may be reference values corresponding to control limits for the thickness of the graphene patterns 1020 and 1120, and may be the same as or different than the first threshold value and the second threshold value, respectively, but are not limited thereto.

In operation S160, the controller (not shown) may compare the content of the interface patterns 1030 and 1130 to a seventh threshold value and an eighth threshold value greater than the seventh threshold value. The seventh threshold value and the eighth threshold value may be reference values corresponding to control limits for the content (e.g., content of silicon carbide in the interface patterns) of the interface patterns 1030 and 1130, and may be the same as or different than the third threshold value and the fourth threshold value, respectively, but are not limited thereto.

Referring to FIGS. 9, 10C, and 11C, in response to the measured thickness of the graphene patterns 1020 and 1120 and/or the measured content of the interface patterns 1030 and 1130 having acceptable values in operation S160, one or more subsequent manufacturing processes may be performed in operation S180. For example, in operation S160, an acceptable value of the measured thickness of the graphene pattern 1020 and 1120 may be greater than or equal to the fifth threshold value and less than or equal to the sixth threshold value. Also, in operation S160, an acceptable value of the measured content of the interface pattern 1030 and 1130 may be greater than or equal to the seventh threshold value and less than or equal to the eighth threshold value. However, example embodiments are not limited thereto.

Figure 10D:
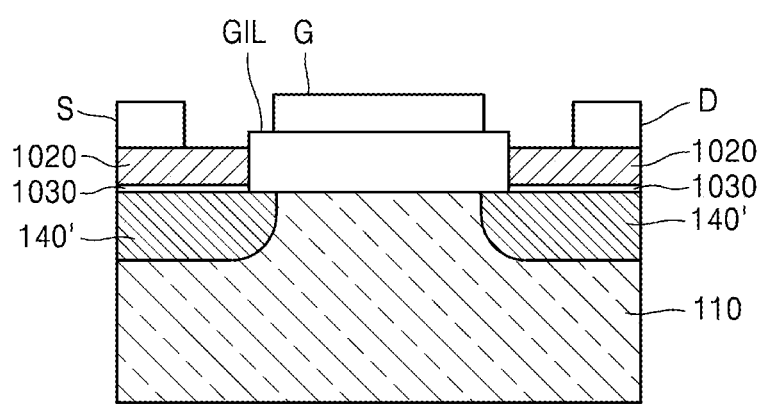

In operation S180, as shown in FIG. 10D, a gate insulating layer GIL may be formed on the portion of the substrate 110 exposed by the graphene pattern 1020 and the interface pattern 1030. The gate insulating layer GIL may include an insulating material, such as silicon oxide or a high-K dielectric material (e.g., silicon nitride, hafnium oxide). Also, a source electrode S, a gate electrode G, and a drain electrode D may be formed on the substrate 110, as shown in FIG. 10D, where the source electrode S and the drain electrode D are spaced apart from each other on the graphene pattern 1020. The gate electrode G may be formed on the gate insulating layer GIL and may be spaced apart from the source electrode S and the drain electrode D. The source electrode S, gate electrode G, and drain electrode D may be formed of a conductive material, such as a metal or a metal alloy.

Figure 11D:
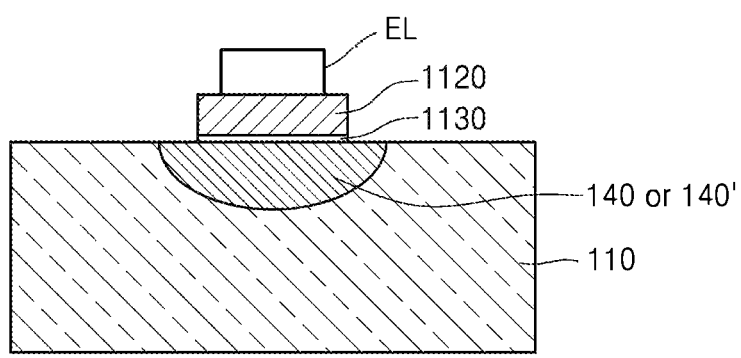

Referring to FIGS. 9 and 11D, in operation S180, an electrode EL may be formed on top of the graphene pattern 1120. The electrode EL may be formed of a conductive material, such as a metal or a metal alloy.

Alternatively, referring to FIGS. 9, 10C, and 11C, operation S170 may be performed in response to the measured thickness of the graphene pattern 1020 and 1120 and/or the measured content of the interface pattern 1030 and 1130 having unacceptable values in operation S160. Operation S170 may be referred to as a rework operation. In operation S170, the graphene pattern 1020 and 1120 and the interface pattern 1030 and 1130 may be removed. After removing the graphene pattern 1020 and 1120 and the interface pattern 1030 and 1130 in operation S170, the method may proceed to operation S110 where another graphene layer 120 may be grown on the substrate 110 as shown in FIGS. 10B and 11B. Another interface layer 130 may be formed between the graphene layer 120 and the substrate 100, or the interface layer 130 may not be formed in other embodiments. Next, the manufacturing method may proceed to operation S120 after operation S110 has been performed.

In some example embodiments, the controller of the XPS may be configured to compare the measured thickness of the graphene and/or interface layers and patterns to reference values in operations S130 and S160. The controller may include processing circuitry, which may include hardware such as logic circuits; a hardware/software combination, such as a processor executing software; or a combination thereof. For example, a processor may include, but is not limited to, a central processing unit (CPU), a graphics processing unit (GPU), an application processor (AP) included in the neuromorphic device, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), or the like. The controller may include a memory for storing reference value, software, and instructions for controlling operations of the XPS instrument discussed herein. The memory may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

The controller, in response to executing instructions from software or commands received by a host, may be transformed into a special-purpose controller for performing operations of the XPS instrument described herein, such as including but not limited to calculating the thickness of the graphene layer 120 and/or graphene patterns 1020 and 1120, measuring a content of the interface layer 130 and/or interface patterns 1030 and 1130; and comparing the measured thickness of the graphene layer 120, graphene patterns 1020 and 1120, and/or content of the interface layer 130 and interface patterns 1030 and 1130 to reference values according to operations S130 and S160 of FIG. 9.

While one or more embodiments have been described, it will be understood by one of ordinary skill in the art that various changes in form and details may be made therein without departing from the spirit and scope of inventive concepts as defined by the following claims.

What is claimed is:

1. A method of measuring a content of silicon carbide included in an interface layer between a silicon substrate and a graphene layer directly grown on the silicon substrate, the method comprising:
   emitting X-ray radiation, using an X-ray photoelectron spectroscopy (XPS) instrument, toward the silicon substrate using a source on the XPS instrument;
   obtaining a spectrum of a photoelectron beam emitted from the silicon substrate in response to emitting the X-ray radiation toward the silicon substrate using a sensor on the XPS instrument; and
   measuring a ratio of the content of silicon carbide relative to the content of the interface layer by using the spectrum of the photoelectron beam emitted from the silicon substrate by using X-ray photoelectron spectroscopy.

2. The method of claim 1, wherein the interface layer includes silicon carbide, silicon oxycarbide, and silicon oxide.

3. The method of claim 1, wherein the interface layer is formed directly on the silicon substrate.

4. The method of claim 2, wherein the content of the silicon carbide is measured based on a ratio of a composition of the silicon carbide to a sum of the composition of the silicon carbide, a composition of the silicon oxycarbide, and a composition of the silicon oxide.

5. The method of claim 4, wherein the content of the silicon carbide is measured by calculating a ratio of an area of a silicon carbide peak to a sum of the area of the silicon carbide peak, an area of a silicon oxycarbide peak, and an area of a silicon oxide peak in the spectrum of the photoelectron beam emitted from the silicon substrate.

6. The method of claim 1, further comprising:
comparing the measured content of the silicon carbide to a first threshold value and a second threshold value using a controller of the XPS instrument.

7. The method of claim 6, wherein the first threshold value is less than the second threshold value.

8. The method of claim 7, further comprising:
patterning the graphene layer in response to the measured content of the silicon carbide being greater than the first threshold value and less than the second threshold value.

9. The method of claim 8, further comprising:
subsequent to the patterning,
emitting second X-ray radiation, using the X-ray photoelectron spectroscopy (XPS) instrument, toward the silicon substrate using the source on the XPS instrument;
obtaining a second spectrum of a second photoelectron beam emitted from the silicon substrate in response to emitting the second X-ray radiation toward the silicon substrate using the sensor on the XPS instrument; and
measuring a second content of the silicon carbide by using the second spectrum of the second photoelectron beam emitted from the silicon substrate.

10. The method of claim 9, further comprising:
comparing the second measured content of the silicon carbide to a third threshold value and a fourth threshold value using the controller of the XPS instrument.

11. The method of claim 10, wherein the third threshold value is less than the fourth threshold value.

12. The method of claim 11, further comprising:
forming an electrode on the patterned graphene layer in response to the measured content of the silicon carbide being greater than the third threshold value and less than the fourth threshold value.

* * * * *